US012751061B2

(12) United States Patent
Kawabata

(10) Patent No.: US 12,751,061 B2
(45) Date of Patent: Sep. 29, 2026

(54) SILICON CARBIDE SEMICONDUCTOR DEVICE AND METHOD OF MANUFACTURING SILICON CARBIDE SEMICONDUCTOR DEVICE

(71) Applicant: Mitsubishi Electric Corporation, Tokyo (JP)

(72) Inventor: Naoyuki Kawabata, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 237 days.

(21) Appl. No.: 18/699,321

(22) PCT Filed: Dec. 22, 2021

(86) PCT No.: PCT/JP2021/047576
§ 371 (c)(1),
(2) Date: Apr. 8, 2024

(87) PCT Pub. No.: WO2023/119485
PCT Pub. Date: Jun. 29, 2023

(65) Prior Publication Data
US 2024/0405077 A1 Dec. 5, 2024

(51) Int. Cl.
*H10D 62/832* (2025.01)
*H10D 12/01* (2025.01)
*H10W 44/00* (2026.01)

(52) U.S. Cl.
CPC ....... *H10D 62/8325* (2025.01); *H10D 12/031* (2025.01); *H10W 44/401* (2026.01)

(58) Field of Classification Search
CPC ........... H10D 62/8325; H10D 30/0291; H10D 30/665; H10D 62/157
See application file for complete search history.

(56) References Cited

U.S. PATENT DOCUMENTS

2014/0197477 A1 7/2014 Onishi
2019/0244812 A1 8/2019 Nishio et al.

FOREIGN PATENT DOCUMENTS

DE 10 2008 008 152 A1 1/2009
JP 5888774 B2 3/2016
JP 2019-140186 A 8/2019
(Continued)

OTHER PUBLICATIONS

International Search Report and Written Opinion mailed on Mar. 8, 2022, received for PCT Application PCT/JP2021/047576, filed on Dec. 12, 2021, 8 pages including English Translation.
(Continued)

*Primary Examiner* — Matthew L Reames
(74) *Attorney, Agent, or Firm* — XSENSUS LLP

(57) ABSTRACT

An object is to provide a technique that enhances the reliability of a silicon carbide semiconductor device without impairing the productivity of the silicon carbide semiconductor device. In a semiconductor structure, an active region and a terminal region connected to the active region along the outer periphery of the active region are defined, a silicon carbide substrate includes a high resistance region provided in the termination region, or provided in the termination region and a portion of the active region that is in contact with the termination region, and in contact with the buffer layer, and resistance of the high resistance region is higher than resistance of a remaining region of the silicon carbide substrate other than the high resistance region.

9 Claims, 12 Drawing Sheets

(56) References Cited

FOREIGN PATENT DOCUMENTS

| | | | |
|---|---|---|---|
| WO | 2012/053081 | A1 | 4/2012 |
| WO | 2015/189929 | A1 | 12/2015 |
| WO | 2021/152651 | A1 | 8/2021 |
| WO | 2021/240782 | A1 | 12/2021 |

OTHER PUBLICATIONS

Ohno et al.. "Influence of growth conditions on basal plane dislocation in 4H—SiC epitaxial layer", Journal of Crystal Growth, 2004, vol. 271, pp. 1-7.

Tawara et al., "Short minority carrier lifetimes in highly nitrogen-doped 4H—SiC epilayers for suppression of the stacking fault formation in PiN diodes", Journal of Applied Physics, 2016, vol. 120, pp. 115101-1 to 115101-7.

Kimoto et al., "Fundamentals of Silicon Carbide Technology: Growth, Characterization, Devices and Applications", 2014, pp. 26-27.

SILICON CARBIDE SEMICONDUCTOR DEVICE AND METHOD OF MANUFACTURING SILICON CARBIDE SEMICONDUCTOR DEVICE

CROSS-REFERENCE TO RELATED APPLICATION

This application is a national stage application, pursuant to 35 U.S.C. § 371, of International Patent Application No. PCT/JP2021/047576, filed Dec. 22, 2021, the entire contents of which are incorporated herein by reference.

TECHNICAL FIELD

The present disclosure relates to a silicon carbide semiconductor device and a method of manufacturing the silicon carbide semiconductor device.

BACKGROUND ART

A problem has been known that when a forward current, that is, a bipolar current, continues to flow through a pn diode composed of silicon carbide (SiC), stacking faults occur in the SiC crystal, increasing the resistance of the pn diode. The reason for this is considered that, due to the recombination energy between minority carriers and majority carriers injected into the pn diode, stacking faults, which are planar defects, expand starting from basal plane dislocations that exist in a SiC substrate, and the expanded stacking faults inhibit the flow of current. The increase in resistance of the pn diode due to such expansion of stacking faults causes a problem of decrease in the reliability of the pn diode.

A similar increase in resistance, consequently leading to an increase in forward voltage, also occurs in SiC vertical-type Metal Oxide Semiconductor Field Effect Transistors (MOSFETs). Vertical MOSFETs have a parasitic pn diode (body diode) between the source and the drain, and a forward current flowing through the body diode may deteriorate reliability in the same manner as in the pn diode in vertical MOSFETs. Therefore, when the body diode of the SIC-MOSFET is used as a freewheeling diode of the MOSFET, the MOSFET characteristics may deteriorate.

Various techniques have been proposed as methods for solving the above-mentioned reliability problem caused by forward current passing through the parasitic pn diode. For example, Non-Patent Document 1 proposes a SiC epitaxial growth method that converts basal plane dislocations inherited from the SiC substrate to the epitaxially grown layer into threading edge dislocations, thereby suppressing the expansion of stacking faults.

For example, Non-Patent Document 2 proposes a method which promotes the recombination of holes and electrons in a buffer layer with a high impurity concentration formed on the SiC substrate to reduce the number of holes that reach the SiC substrate, thereby suppressing the generation of stacking faults from basal plane dislocations that exist in the SiC substrate.

Further, for example, Patent Document 1 proposes performing recovery annealing after ion implantation into a SiC substrate at specific intervals. According to the method, basal plane dislocations existing in the ion-implanted portions are not only degenerated within the SiC substrate but also, basal plane dislocations in the non-ion-implanted portions are degenerated by the stress from the ion-implanted portions within the substrate, thereby suppressing electrical degradation.

Moreover, for example, in patent document 2, a technique is proposed that disrupts the crystal structure across the entire surface of the SiC substrate by performing ion implantation at specific intervals, and subsequently restores the crystal by heat treatment, thereby converting basal plane dislocations within the SiC substrate into threading edge dislocations.

Note that Non-Patent Document 3 discloses the relationship between impurity concentration and resistivity of 4H-SiC at room temperature.

PRIOR ART DOCUMENTS

Patent Document(s)

[Patent Document 1] International Publication No. 2015/189929

[Patent Document 2] Japanese Patent Application Laid-Open No. 2019-140186

Non-Patent Document(s)

[Non-Patent Document 1] T. Ohno and five others, "Influence of growth conditions on basal plane dislocation in 4H-SiC epitaxial layer," Journal of Crystal Growth, 2004, Vol. 271

[Non-Patent Document 2] T. Tawara and thirteen others, "Short minority carrier lifetimes in highly nitrogen-doped 4H-SiC epilayers for suppression of the stacking fault formation in PiN diodes", Journal of Applied Physics, 2016, Vol. 120, pp. 115101

[Non-Patent Document 3] Tsunenobu Kimoto and one other, "Fundamentals of Silicon Carbide Technology: Growth, Characterization, Devices and Applications", 2014

SUMMARY

Problem to be Solved by the Invention

According to the techniques disclosed in Non-Patent Documents 1 and 2, the deterioration of the characteristics of SIC-MOSFETs is suppressed to some extent. However, there is a problem of an increase in productivity costs due to the requirement of forming a thick buffer layer in order to apply a large current to the body diode. Also, there is a problem of a decrease in productivity due to an increase in manufacturing variation when a high concentration of impurities is injected into the buffer layer.

The technique disclosed in Patent Document 1 has a problem in that a recombination center is formed at the pn bonded portion, and the characteristics of the body diode are significantly degraded, making it impossible to flow a large current through the body diode. The technique disclosed in Patent Document 2 has a problem in that ions are implanted into most of the current path that makes the ion implanted region become a resistance, leading to the deterioration of characteristics of the body diode and MOSFET.

The present disclosure has been made in view of the above problems and has an object to provide a technique that enhances the reliability of a silicon carbide semiconductor device without impairing the productivity of silicon carbide semiconductor device.

Means to Solve the Problem

According to the present disclosure, a silicon carbide semiconductor device includes a semiconductor structure including a silicon carbide substrate of a first conductivity type, a buffer layer of the first conductivity type provided on the silicon carbide substrate, and a drift layer of the first conductivity type provided on the buffer layer, a source pad, a gate insulating film, and a gate electrode, in which in the semiconductor structure, an active region and a termination region connected to the active region along the outer periphery of the active region are defined, the active region of the semiconductor structure includes a source region of the first conductivity type selectively provided in an upper portion of the drift layer and electrically connected to the source pad, and a first well region of a second conductivity type that isolates the source region from the drift layer and is insulated from the gate electrode by the gate insulating film, the termination region of the semiconductor structure includes a second well region of the second conductivity type provided in the upper portion of the drift layer, and a JTE region of the second conductivity type provided outside of the second well region, the silicon carbide substrate includes a high resistance region provided in the termination region, or provided in the termination region and a portion of the active region that is in contact with the termination region, and in contact with the buffer layer, and resistance of the high resistance region is higher than resistance of a remaining region of the silicon carbide substrate other than the high resistance region.

Effects of the Invention

According to the present disclosure, the silicon carbide substrate includes a high resistance region provided in the termination region, or provided in the termination region and a portion of the active region that is in contact with the termination region, and in contact with the buffer layer. According to such a configuration, the reliability of a silicon carbide semiconductor device is enhanced without impairing the productivity of the silicon carbide semiconductor device.

The purpose, feature, phase, and advantage of the present disclosure will become more apparent from the following description and the accompanying drawings.

DESCRIPTION OF EMBODIMENT(S)

Figure 1:
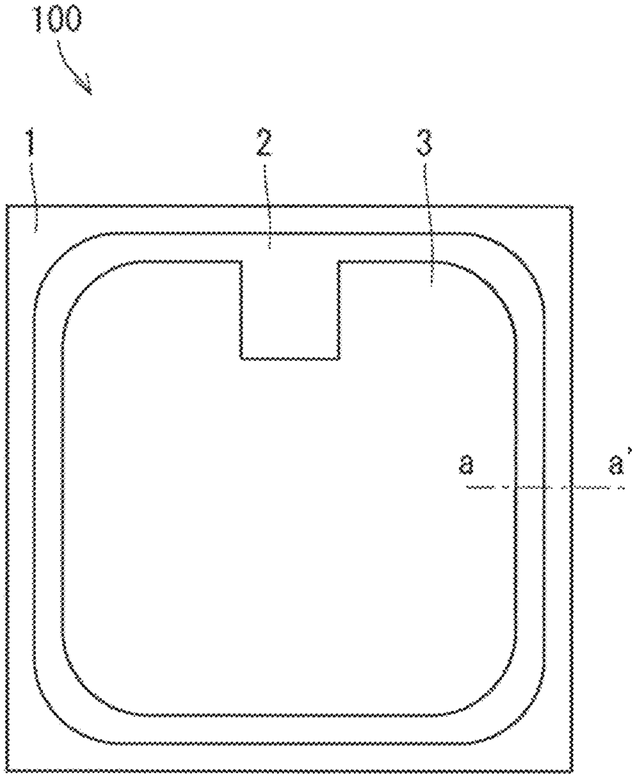
FIG. 1 A plan view schematically illustrating a configuration of a silicon carbide semiconductor device according to Embodiment 1.

Embodiments will be described below with reference to the accompanying drawings The features described in each Embodiment below are illustrative, and not all features are necessarily essential. Also, in the description given below, the same or similar reference numerals are given to the same components in a plurality of Embodiments, and different components will be mainly explained. Also, in the following description, terms indicating specific positions or directions such as “upper”.

“lower”, “left”, “right”, “front”, and “back” may not necessarily coincide with the positions or directions at the time of implementation. Also, when mentioning a certain part having a higher concentration than another part, this refers, for example, to the average concentration of a certain part being higher than the average concentration of another part. Conversely, when mentioning a certain part having a lower concentration than another part, this refers, for example, to the average concentration of a certain part being lower than the average concentration of another part. Although in the following description, a first conductive type represents n-type and a second conductive type represents p-type, the first conductive type may present p-type and the second conductive type may represent n-type.

Embodiment 1

<Configuration>

FIG. 1 is a plan view (specifically, top view) schematically illustrating a configuration of a silicon carbide semiconductor device 100 according to Embodiment 1. An example in which the silicon carbide semiconductor device 100 represents a field effect transistor (MOSFET) using a silicon carbide substrate (SiC substrate) as a base material will be described below.

As illustrated in FIG. 1, the silicon carbide semiconductor device 100 includes a SiC epitaxial substrate 1, a gate pad 2, and a source pad 3. The gate pad 2 is provided at the upper center of the SiC epitaxial substrate 1 in plan view, and a gate voltage is applied from a control circuit (not illustrated) outside the silicon carbide semiconductor device 100. A current controlled by the gate voltage flows through the source pad 3.

Figure 2:
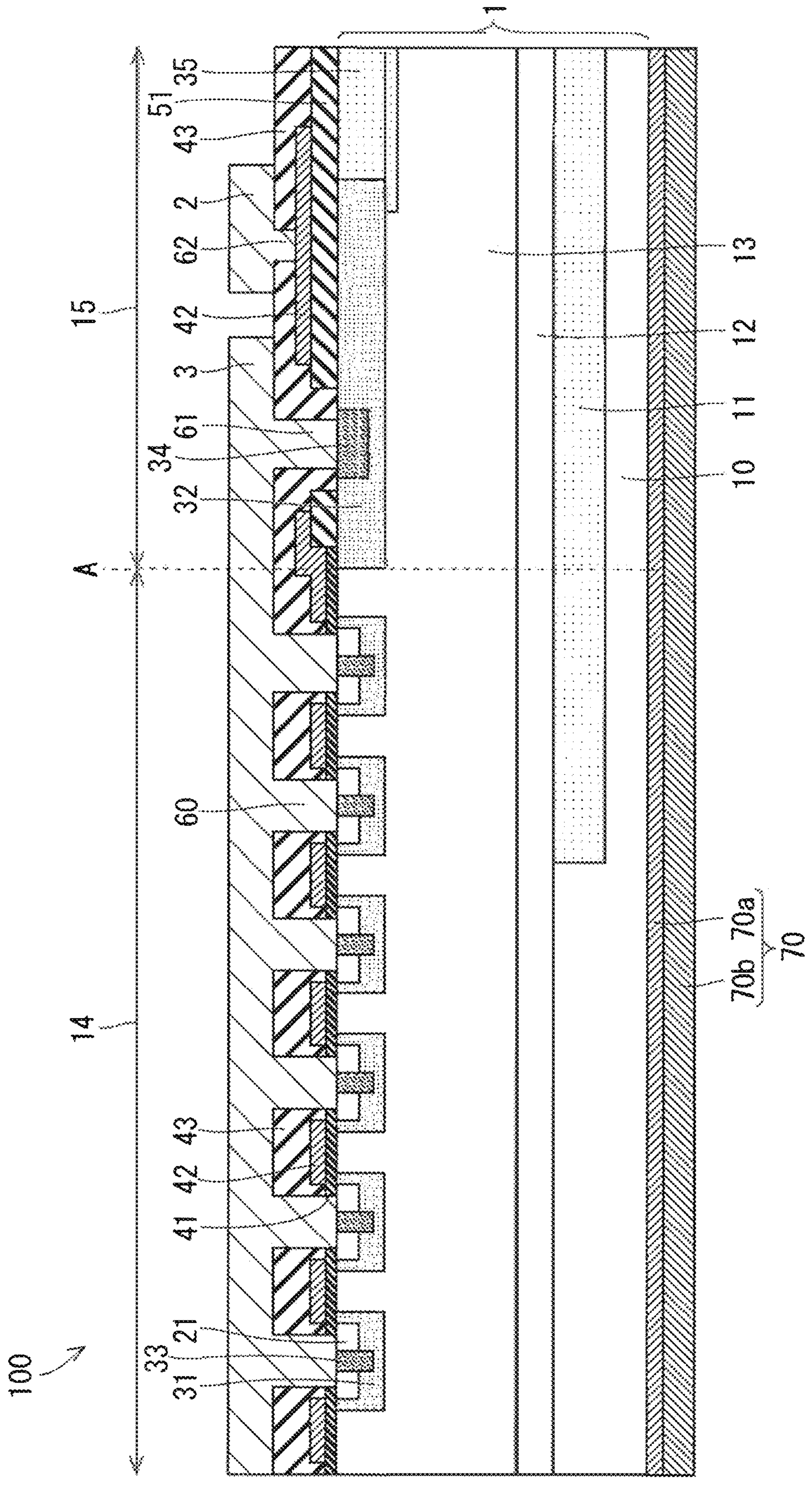
FIG. 2 A cross-sectional view schematically illustrating the configuration of an end portion of the silicon carbide semiconductor device according to Embodiment 1.

FIG. 2 is a cross-sectional view schematically illustrating the configuration of an end portion of the silicon carbide semiconductor device 100 according to Embodiment 1, and is a cross-sectional view taken along line a-a' in FIG. 1. The right side of FIG. 2 corresponds to the end portion side of the silicon carbide semiconductor device 100, and the left side of FIG. 2 corresponds to the center side of the silicon carbide semiconductor device 100.

The SiC epitaxial substrate 1 being a semiconductor structure includes an n-type SiC substrate 10, an n-type buffer layer 12, and an n-type drift layer 13.

The SiC substrate 10 includes a high resistance region 11. The high resistance region 11 will be described in detail later.

The buffer layer 12 is provided on the SiC substrate 10 and is formed, for example, by epitaxial growth. The buffer layer 12 has a function of recombining holes injected from above the silicon carbide semiconductor device 100 and reducing the density of holes reaching the SiC substrate 10. The buffer layer 12 may have a function of converting basal plane dislocations existing in the SiC substrate 10 into threading edge dislocations, and may be a plurality of layers of two or more layers.

The higher the impurity concentration of the buffer layer 12, the more the density of holes that reach the SiC substrate 10 can be reduced, thereby increasing the ability to suppress the expansion of stacking faults with respect to the applied current. For this reason, the impurity concentration and the film thickness of the buffer layer 12 are determined based on the current density when the device is energized. For example, the n-type impurity concentration of the buffer layer 12 is preferably $1\times10^{18}$ $cm^{-3}$ or more and $2\times10^{19}$ $cm^{-3}$ or less, more preferably $1\times10^{15}$ $cm^{-3}$ more and $1\times10^{19}$ $cm^{-3}$ or less.

The drift layer 13 is provided on the buffer layer 12, and the impurity concentration of the drift layer 13 is lower than the n-type impurity concentrations of the SiC substrate 10 and the buffer layer 12. The impurity concentration and thickness of the drift layer 13 are determined based on the breakdown voltage of the semiconductor element. For example, the impurity concentration of the drift layer 13 is $1\times10^{14}$ $cm^{-3}$ or more and $1\times10^{17}$ $cm^{-3}$ or less. Note that in order to maintain the breakdown voltage of the silicon carbide semiconductor device 100, the n-type impurity concentration of the drift layer 13 is preferably 5×1016 $cm^{-3}$ or less. For example, the thickness of the drift layer 13 is Sum or more and several hundred μm or less.

In the SiC epitaxial substrate 1 including the SiC substrate 10, the buffer layer 12, and the drift layer 13, an active region 14 and a termination region 15 are defined. The active region 14 is a region where an element structure such as a MOSFET is provided. The termination region 15 is a region connected to the active region 14 along the outer periphery of the active region 14.

First, the configuration of the active region 14 will be described. The active region 14 in the SiC epitaxial substrate 1 includes an n-type source region 21, a p-type first well region 31, and a p-type first well contact region 33.

The first well region 31 is selectively provided in the upper portion of the drift layer 13 of the active region 14. The source region 21 and the first well contact region 33 are selectively provided in the upper portion of the first well region 31. The p-type impurity concentration of the first well contact region 33 is higher than the p-type impurity concentration of the first well region 31. Note that the first well contact region 33 is enclosed by the first well region 31 in plan view.

The silicon carbide semiconductor device 100 includes not only the source pad 3 but also a gate insulating film 41, a gate electrode 42, and an interlayer insulating film 43 in the active region 14. The gate insulating film 41 is provided on the source regions 21, the first well regions 31 interposed between the source regions 21, and the drift layer 13 interposed between the first well regions 31 so that the gate insulating film 41 overlaps the source regions 21 of two adjacent cells in plan view. That is, the gate insulating film 41 is provided from one source region 21 to the other source region 21 of the source regions 21 of two adjacent cells.

The gate electrode 42 is provided on the gate insulating film 41, and the interlayer insulating film 43 covers the gate electrode 42. As will be described later, the gate electrodes 42 are electrically connected to the gate pad 2 in FIG. 1. The source pad 3 is composed of metal wiring of such as an aluminum electrode, and is electrically connected to the first well contact regions 33 and the source regions 21 through contact boles 60 provided in the interlayer insulating film 43.

The source region 21 configured as described above is selectively provided in the upper portion of the drift layer 13 and electrically connected to the source pad 3. The first well region 31 isolates the source region 21 from the drift layer 13 and is insulated from the gate electrode 42 by the gate insulating film 41. According to such a configuration, when a gate voltage exceeding the threshold voltage is applied to the gate electrode 42, a channel through which the current flows is formed in the first well region 31 between the drift layer 13 and the source region 21.

In FIG. 2, a planar MOSFET is illustrated as an MOSFET according to Embodiment 1 in which the gate electrodes 42 are provided above in the upper surface of the SiC epitaxial substrate 1. Yet, the MOSFET according to Embodiment 1 may be a trench-type MOSFET in which a gate electrode is provided in a trench in the upper portion of the SiC epitaxial substrate 1.

Next, the configuration of the termination region 15 will be described. The termination region 15 in the SiC epitaxial substrate 1 includes a p-type second well region 32, a p-type second well contact region 34, and a p-type junction termination extension (JTE) region 35.

The second well region 32 is selectively provided in the upper portion of the drift layer 13 of the termination region 15 and is provided so as to enclose the active region 14. The second well contact region 34 is selectively provided in the upper portion of the second well region 32. The second well contact region 34 is a region for reducing the contact resistance with the source pad 3, which is a metal electrode, and the p-type impurity concentration of the second well contact region 34 is higher than the p-type impurity concentration of the second well region 32.

The JTE region 35 is a region for maintaining the breakdown voltage of the silicon carbide semiconductor device 100, and is provided in the upper portion of the drift layer 13 and outside of the second well region 32 in termination region 15. The JTE region 35 may have, for example, a field limiting ring (FLR) structure provided in a ring shape along the outer periphery of the silicon carbide semiconductor device 100. In plan view, the portion of the JTE region 35 on the active region 14 side is connected to the outermost peripheral portion of the region consisting of the second well region 32 and the second well contact region 34. Note that the p-type impurity concentration of the JTE region 35 is lower than the p-type impurity concentration of the second well region 32.

The SiC epitaxial substrate 1 in the termination region 15 includes a portion of the n-type drift layer 13, a portion of the n-type buffer layer 12, the p-type second well region 32, and the p-type second well contact region 34, and the p-type JTE region 35. In plan view, the second well region 32 and the JTE region 35 are provided along the outer periphery of the active region 14. The SiC epitaxial substrate 1 in the termination region 15 configured in this manner includes a pn junction including the p-type second well region 32, the n-type drift layer 13, and the like, and the breakdown voltage of the silicon carbide semiconductor device 100 can be maintained by the pn junction.

As illustrated in the example in FIG. 2, the gate insulating film 41, the gate electrode 42, the interlayer insulating film 43, and the source pad 3 are provided in both the active region 14 and the termination region 15, across the boundary A between the active region 14 and the termination region 15. Note that in Embodiment 1, the position of the boundary A between the active region 14 and the termination region 15 corresponds to the position of the end portion of the second well region 32 and the end portion of the JTE region 35 that is closer to the center of the active region 14.

The silicon carbide semiconductor device 100 includes, in the termination region 15, the gate pad 2 and a field insulating film 51, in addition to the source pad 3, the gate electrode 42, and the interlayer insulating film 43. The field insulating film 51 covers the outer periphery portion of the second well region 32 and the entire JTE region 35. That is, the field insulating film 51 extends beyond the outer peripheral edge of the second well region 32 to the outside of the second well region 32. The field insulating film 51 is not provided in the active region 14, yet is provided along the outer periphery of the active region 14. In other words, the field insulating film 51 has an opening that exposes the active region 14.

The source pad 3 in the termination region 15 is connected to the second well contact region 34 provided in the second well region 32 to form an ohmic contact through a contact hole 61 provided in the interlayer insulating film 43. The gate electrode 42 in the termination region 15 is provided on at least one of the second well region 32 or the JTE region 35 via the gate insulating film 41 or the field insulating film 51. The gate pad 2 is provided on the upper surface of the interlayer insulating film 43 covering the gate electrode 42 in the termination region 15. Also, the gate pad 2 is connected to the gate electrode 42 through a contact hole 62 provided in the interlayer insulating film 43.

A back surface electrode 70 is provided on the lower surface (back surface) of the SiC substrate 10. The back surface electrode 70 includes an ohmic contact region 70*a* provided on the lower surface of the SiC substrate 10, and a back surface electrode layer 70*b* provided on the lower surface of the ohmic contact region 70*a*.

Here, the SiC substrate 10 of the silicon carbide semiconductor device 100 according to Embodiment 1 includes a high resistance region 11. In the example of FIG. 2, the high resistance region 11 is provided in the termination region 15 and a portion of the active region 14 that is in contact with the termination region 15, and is in contact with the buffer layer 12. However, the high resistance region 11 is not limited to the example illustrated in FIG. 2, and may be provided not in the active region 14 but in the termination region 15 and in contact with the buffer layer 12. Note that the high resistance region 11 may be provided in at least a portion of the termination region 15.

The resistance of the high resistance region 11 is higher than the resistance of the remaining region of the SiC substrate 10 other than the high resistance region 11. In Embodiment 1, the high resistance region 11 is formed by implanting ions, which are p-type impurities, into the n-type SiC substrate 10. In other words, in Embodiment 1, ions, which are impurities of a conductivity type different from that of the SiC substrate 10, are implanted to cancel carriers in a portion of the SiC substrate 10 and reduce the effective carrier concentration in a portion of the SiC substrate 10, thereby forming the high resistance region 11.

<Method of Manufacturing>

Next, a method of manufacturing the silicon carbide semiconductor device 100 according to Embodiment 1 will be described. FIGS. 3 to 9 are schematic cross-sectional views for explaining the method of manufacturing the silicon carbide semiconductor device 100 according to Embodiment 1.

Figure 3:
FIG. 3 A cross-sectional view for explaining a method of manufacturing the silicon carbide semiconductor device according to Embodiment I.
Figure 4:
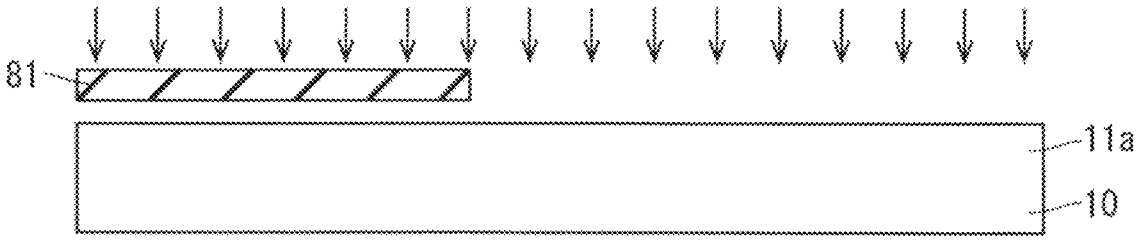
FIG. 4 A cross-sectional view for explaining the method of manufacturing the silicon carbide semiconductor device according to Embodiment 1.
Figure 5:
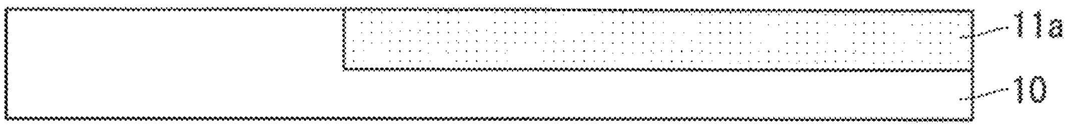
FIG. 5 A cross-sectional view for explaining the method of manufacturing the silicon carbide semiconductor device according to Embodiment 1.

As illustrated in FIG. 3, a low-resistance n-type SiC substrate 10 with a (0001) plane orientation having a 4H polytype and the main surface, that is, the upper surface, having an off-angle is prepared. Then, as illustrated in FIG. 4, an implantation mask 81 is formed on the front surface of the SiC substrate 10 using a metal mask, an oxide film mask, a resist mask, or the like. Then, as illustrated in FIG. 5, ions are implanted into a temporary region 11*a* of the SiC substrate 10 without implanting the ions into any region other than the temporary region 11*a*, the temporary region 11*a* being to become the high resistance region 11 of the SiC substrate 10. The ions to be implanted may be p-type impurities, such as aluminum (Al) or boron (B). The impurity concentration of ion implantation is, for example, $1\times10^{18}$ $cm^{-3}$ or more and 2×1019 $cm^{-3}$ or less. The energy for ion implantation is, for example, 10 keV or more and 10 MeV or less.

Figure 6:
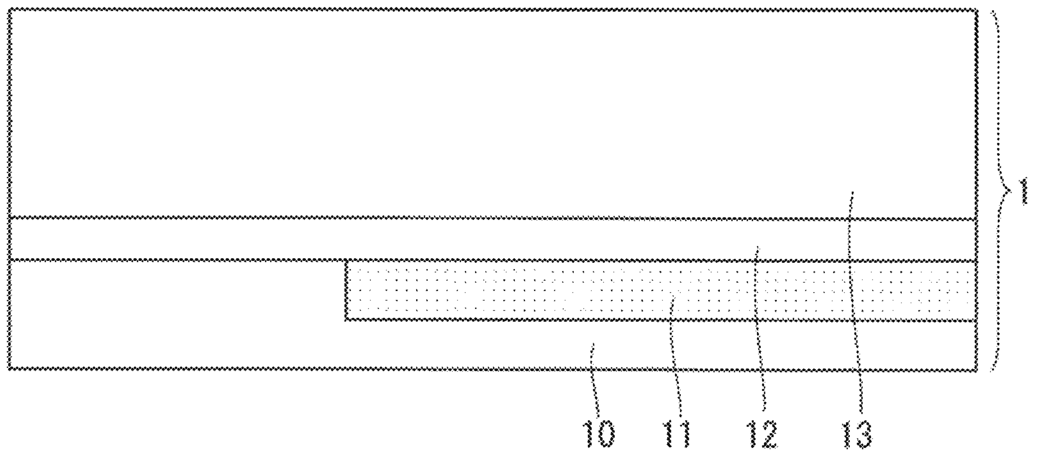
FIG. 6 A cross-sectional view for explaining the method of manufacturing the silicon carbide semiconductor device according to Embodiment 1.

Next, as illustrated in FIG. 6, the chemical vapor deposition (CVD) method is used to, for example, epitaxially grow the n-type buffer layer 12 composed of a silicon carbide layer with the impurity concentration of $1\times10^{18}$ $cm^{-3}$ or more and $1\times10^{19}$ $cm^{-3}$ or less. The thickness of the buffer layer 12 is, for example, 5 μm. Next, the n-type drift layer 13 composed of a silicon carbide layer with the impurity concentration of, for example, 1×1014 $cm^{-3}$ or more and $1\times10^{17}$ $cm^{-3}$ or less is epitaxially grown by the CVD method or the like. The thickness of the drift layer 13 is, for example, 5 μm or more and 100 μm or less, and preferably 10 μm.

Epitaxial growth is conducted at a temperature range of 1500° C. to 1700° C. The recovery of crystal defects caused by ion implantation into the SiC substrate 10 and activation of impurities are simultaneously carried out by maintaining high temperature during epitaxial growth. By recovering crystal defects by increasing the temperature during epitaxial growth, the generation of crystal defects from the ion-implanted temporary region 11*a* can be suppressed, and the annealing process after ion implantation can be omitted as well. Through such processes, the SiC epitaxial substrate 1 is formed, and the temporary region 11*a* becomes the high resistance region 11.

Figure 7:
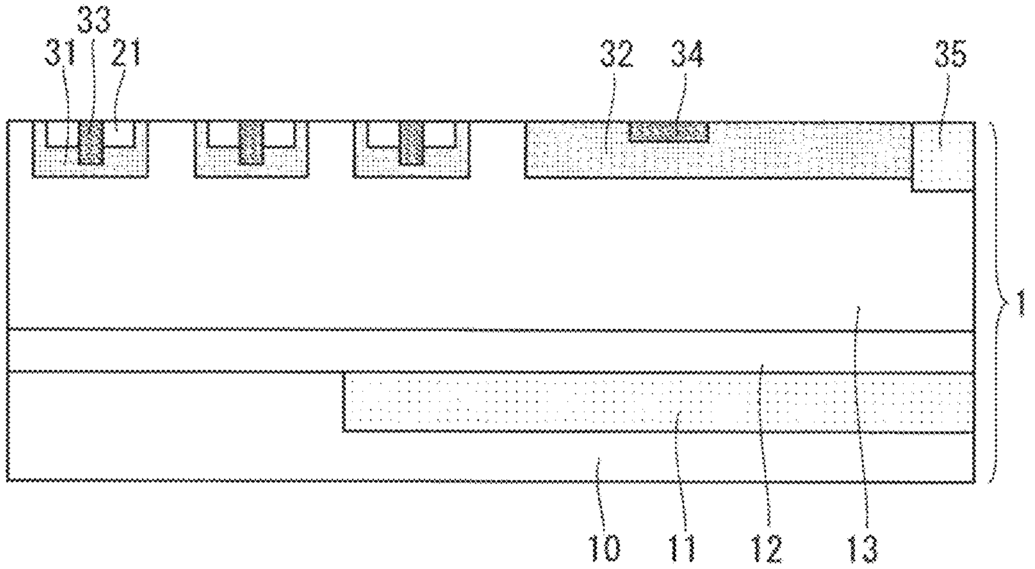
FIG. 7 A cross-sectional view for explaining the method of manufacturing the silicon carbide semiconductor device according to Embodiment 1.

Next, as illustrated in FIG. 7, a plurality of impurity regions are formed in the surface layer of the drift layer 13 by repeating a photolithography process for forming a resist mask and an ion implantation process using the resist mask as an implantation mask. Specifically, in the upper portion of the drift layer 13, a p-type first well region 31, a second well region 32, a first well contact region 33, a second well contact region 34, and an n-type source region 21 are formed. The formation of the first well region 31 will be described below as an example of the formation of these regions.

First, an implantation mask is formed using photoresist or the like in a predetermined region in the upper portion of the drift layer 13, and Al, being p-type impurities, is ion-implanted. At this point, the depth of Al ion implantation is set to a depth that does not exceed the thickness of the drift layer 13 (for example, about 0.3 to 3 μm). Further, the impurity concentration of the ion-implanted Al is, for example, $1\times10^{17}$ $cm^{-3}$ or more and 1×1019 $cm^{-3}$ or less, set higher than the impurity concentration of the drift layer 13. The implantation mask is then removed. The region into which Al ions are implanted is to become the first well region 31.

The formation of the second well region 32, the first well contact region 33, the second well contact region 34, and the source region 21 is also generally the same as the formation of the first well region 31. Note that nitrogen (N), for example, may be used as the n-type impurities, and B, for example, may be used as the p-type impurities.

In the above ion implantation process, the first well region 31 and the second well region 32 may be collectively formed in the same ion implantation process. Similarly, the first well contact region 33 and the second well contact region 34 may be collectively formed in the same ion implantation process.

The impurity concentration of the first well region 31 and the impurity concentration of the second well region 32 are, for example, 1.0×1017 $cm^{-3}$ or more and $1.0\times10^{19}$ $cm^{-3}$ or less. Further, the impurity concentration of the source region 21 is higher than the impurity concentration of the first well region 31, and is, for example, $1.0\times10^{19}$ $cm^{-3}$ or more and $1.0\times10^{21}$ $cm^{-3}$ or less. Further, the dosage of the first well contact region 33 and the dosage of the JTE region 35 are preferably $0.5\times10^{13}$ $cm^{-2}$ or more and $5\times10^{13}$ $cm^{-2}$ or less, and are, for example, $1.0\times10^{13}$ $cm^{-2}$.

The implantation energy for forming the first well region 31 and the second well region 32 is, for example. 100 keV or more and 700 keV or less. The impurity concentration of the JTE region 35 calculated from the dosage [$cm^{-2}$] is $1\times10^{17}$ $cm^{-3}$ or more and $1\times10^{29}$ $cm^{-3}$ or less. Further, the implantation energy for forming the source region 21 is, for example, 20 keV or more and 300 keV or less.

After ion implantation, annealing is conducted at 1500° C. or higher using a heat treatment device. Accordingly, the ion-implanted impurities are activated, and the first well region 31, the second well region 32, the first well contact region 33, the second well contact region 34, and the source region 21 are formed. That is, the source region 21 and first well region 31 included in the MOSFET are formed in the region of the drift layer 13 that is to become the active region 14.

Figure 8:
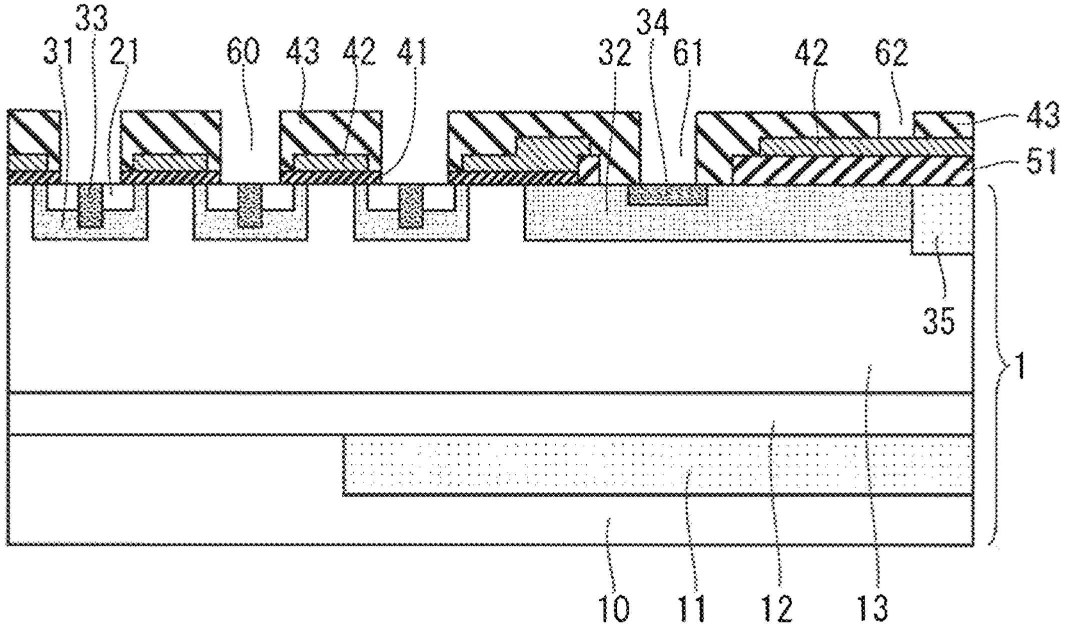
FIG. 8 A cross-sectional view for explaining the method of manufacturing the silicon carbide semiconductor device according to Embodiment 1.

Next, as illustrated in FIG. 8, a first $SiO_2$ film having a thickness of, for example, 0.5 μm or more and 2 μm or less is formed on the upper surface of the SiC epitaxial substrate 1 by, for example, the CVD method. Then, the field insulating film 51 is formed by patterning the first $SiO_2$ film through the photolithography process and the etching process. At this point, the field insulating film 51 is formed in a pattern that covers a portion of the second well region 32 and extends beyond the outer peripheral edge of the second well region 32 to the outside of the second well region 32. At this point, the field insulating film S1 may cover a portion of the second well contact region 34.

Subsequently, the upper surface of the drift layer 13 that is not covered with the field insulating film 51 is thermally oxidized to form a second $SiO_2$ film that is to become the gate insulating film 41. Then, a conductive polycrystalline silicon film is formed on the upper surface of the second $SiO_2$ film by the low pressure CVD method, and patterning the polycrystalline silicon film through the photolithography process and the etching process, thereby forming the gate electrode 42. At this point, the gate electrode 42 may be formed so as to bring itself over the upper surface of the field insulating film 51.

Thereafter, a third $SiO_2$ film, which is to become the interlayer insulating film 43, is formed so as to cover the gate electrode 42 by, for example, the CVD method. Then, by patterning the second $SiO_2$ film and the third $SiO_2$ film by the photolithography process and the etching process, the gate insulating film 41 and the interlayer insulating film 43 in which contact holes 60, 61, and 62 are provided are formed. Note that the contact holes 60 and 61 extend through the gate insulating film 41, the gate electrode 42, and the interlayer insulating film 43, and expose the first well contact region 33, the source region 21, and the second well contact region 34. The contact hole 62 extends through the interlayer insulating film 43 in termination region 15 to expose the gate electrode 42. Note that in this process, the interlayer insulating film 43 on the upper surface of the field insulating film 51 and the interlayer insulating film 43 at the edge portion of the drift layer 13 may be removed, respectively.

Figure 9:
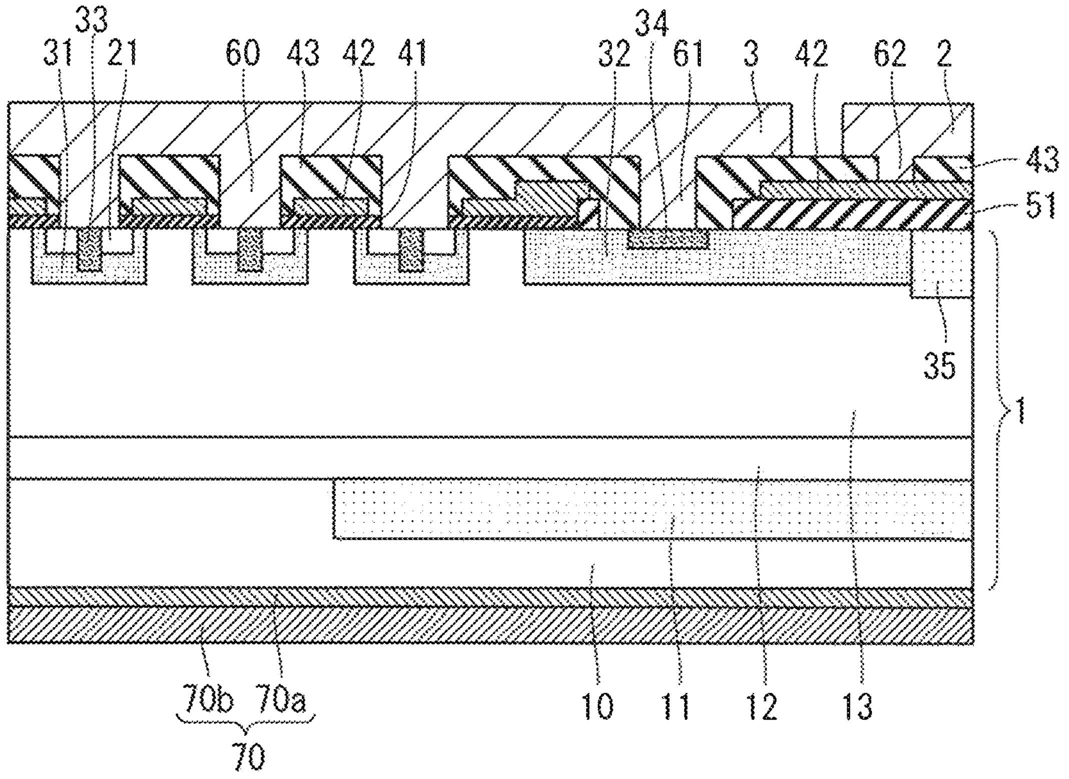
FIG. 9 A cross-sectional view for explaining the method of manufacturing the silicon carbide semiconductor device according to Embodiment 1.

Next, as illustrated in FIG. 9, a conductive material that is to become the source pad 3 and the gate pad 2 is formed on the upper surface of the SiC epitaxial substrate 1 and the like, by sputtering, vapor deposition, or the like. The conductive material that is to become these surface electrodes (the source pad 3 and the gate pad 2) is, for example, a metal containing one or more of Ti, Ni, Al, Cu, and Au, or an Al alloy such as Al—Si, is used. Note that in the SiC epitaxial substrate 1, a silicide layer may be formed in advance by heat treatment on the portion that contacts the surface electrode.

Next, the source pad 3 and the gate pad 2 separated from each other are formed from the conductive material by patterning the conductive material through the photolithography process and the etching process. At this point, with reference to the position of the outer peripheral edge of the second well region 32, the conductive material is patterned such that the outer peripheral edge of the surface electrode at the corner portion of the termination region IS in plan view is located inside the outer peripheral edge of the surface electrode in the linear portion in the termination region 15 in plan view. That is, the conductive material is patterned so that the outer peripheral edge of the corner portion of the surface electrode is not located outside the outer peripheral edge of the linear portion.

Next, a surface protective film may be formed to cover the outer peripheral edge of the surface electrode and at least a portion of the upper surface of the SiC epitaxial substrate 1 in the termination region 15. The surface protective film is processed into a desired shape by, for example, coating photosensitive polyimide and exposure to light.

Next, a conductive material that is to become the back surface electrode layer **70*b* is formed on the lower surface of the SiC epitaxial substrate I by sputtering, vapor deposition, or the like. As the conductive material of the back surface electrode layer 70*b***, for example, a metal containing one or more of Ti, Ni, Al, Cu, and Au is used.

Note that, before forming the conductive material of the back surface electrode layer **70*b*, thinning of the SiC epitaxial substrate 1 may be conducted in order to lower the electrical resistivity during operation of the silicon carbide semiconductor device 100. Thinning is achieved by grinding or polishing the bottom surface of the SiC substrate 10, or by using both techniques, carrying out removal until the SiC epitaxial substrate 1 reaches a desired thickness. The thickness of the SiC epitaxial substrate 1** after thinning is, for example, about 100 μm, and can be 50 μm or more and 200 μm or less.

Next, the back surface electrode layer **70*b* and the SiC substrate 10 are reacted to form a silicide layer. By forming the silicide layer, the back surface electrode layer 70*b* and the SiC substrate 10 come into ohmic contact. A region of the silicide layer is to become an ohmic contact region 70*a*. The ohmic contact region 70*a* is formed, for example, by irradiation with a focused laser beam or by annealing. After forming the ohmic contact region 70*a*, the front surface oxide film is removed to form the back surface electrode 70**.

Note that, although in the silicon carbide semiconductor device 100, an example of which is illustrated in FIG. 1, the gate pad 2, being a pad, is provided at the upper center in plan view, the position and the shape of the gate pad 2, being a pad, may be arbitrarily changed. For example, the gate pad 2 may be provided at a corner portion of the silicon carbide semiconductor device, or the gate pad 2 may be provided so as to traverse the center portion of the silicon carbide semiconductor device.

<Simulation Results>

The inventor has revealed that when a large current of 500 A/cm$^2$ or more is applied to the body diode of a SIC-MOSFET, a region emerges at the boundary A between the active region 14 and the termination region 15 where the hole current density (hole density) is at most twice as much as the center portion of the active region 14. The inventor has revealed that stacking faults occur preferentially in the active-termination boundary region including the boundary A between the active region 14 and the termination region 15. The inventor has also revealed that the above phenomenon becomes more pronounced as the current density applied to the center portion of the active region 14 increases, causing a relatively larger current to concentrate in the active-termination boundary region compared to the center portion of the active region 14.

When a large current flows in even a portion near the boundary between the SIC substrate 10 and the buffer layer 12 in plan view, the buffer layer 12 deeds to be designed appropriately for the maximum current. However, even when an average current of 500 A/cm$^2$ flows through the body diode, it becomes necessary to introduce the buffer layer 12 suitable for 1000 A/cm$^2$, in order to suppress the deterioration of device characteristics, which is undesirable from the viewpoint of productivity.

Whereas, the silicon carbide semiconductor device 100 according to Embodiment 1, with the above configuration, enables a reduction in the concentration of the hole current occurring in the active-termination boundary region without significantly impairing the characteristics of the body diode. As a result, stacking faults generated in the SiC substrate 10 in the active-termination boundary region can be suppressed, thereby enhancing the reliability of the silicon carbide semiconductor device. Further, the buffer layer 12 that suppresses the occurrence of stacking faults can be made thinner, this allows to maintain productivity of the silicon carbide semiconductor devices. These will be described below while illustrating the simulation results.

Figure 10:
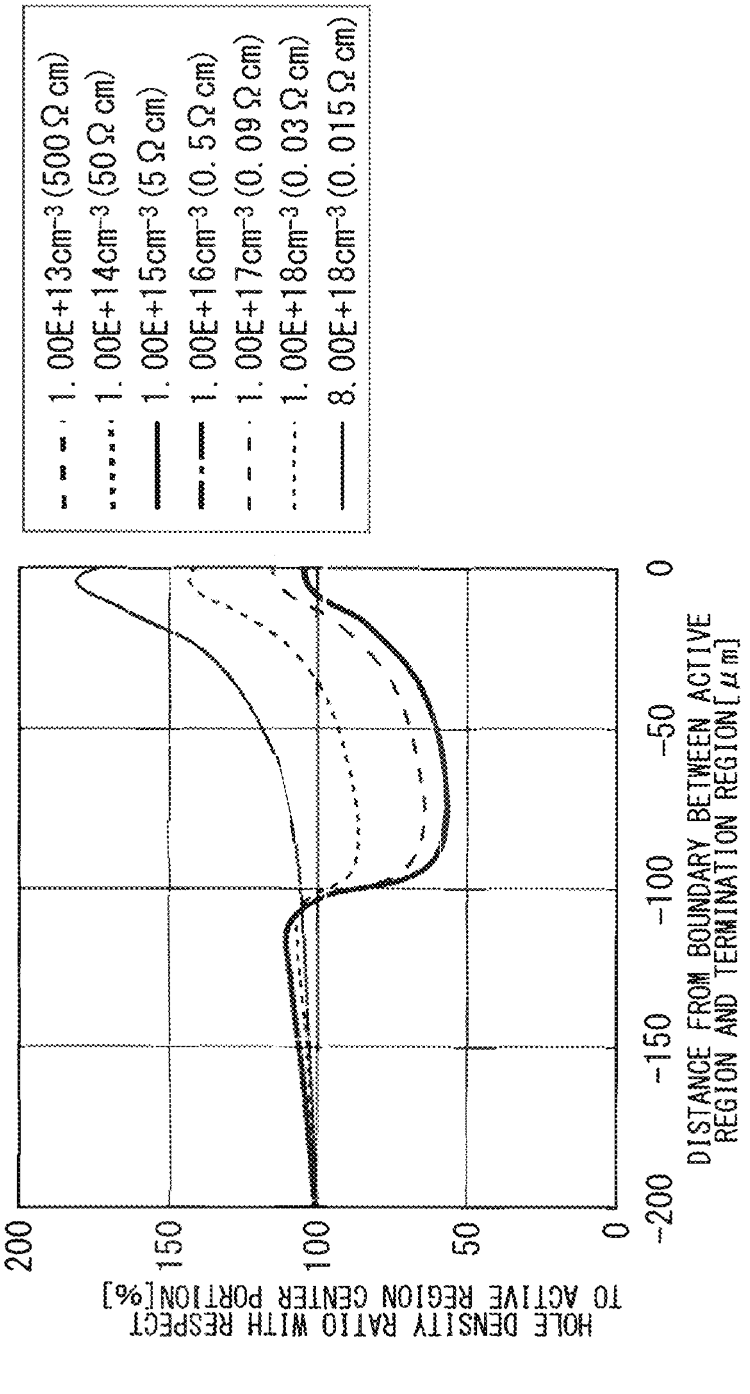
FIG. 10 A graph illustrating simulation results of the silicon carbide semiconductor device according to the Embodiment 1.

FIG. 10 is a simulation result graph of the hole density distribution when the active region 14 of the SiC-MOSFET is replaced with a PN diode and the high resistance region 11 having the width and the thickness of 100 μm and 10 μm, respectively, is provided on the SiC substrate 10. It has been confirmed that whether a MOSFET or a PN diode is provided in the active region 14, the hole density distribution results illustrate the same tendency. In the simulation, the applied current was 1000A/cm$^2$.

As disclosed in Non-Patent Document 3, the resistivity of the SiC substrate 10 can be uniquely determined by the n-type impurity concentration in the SiC substrate 10, and the higher the n-type impurity concentration, the lower the resistivity. Therefore, in this simulation, the n-type impurity concentration in the high resistance region 11 was gradually increased to 1E13 cm$^{-3}$, 1E14 cm$^{-3}$, 1E15 cm$^{7}$, 1E16 cm$^{-3}$, 1E17 cm$^{-3}$, and 1E18 cm$^{-3}$. Note that this change is substantially the same as decreasing the concentration of p-type impurities to be implanted into the n-type semiconductor layer. The average resistivity of the above n-type impurity concentration is approximately 500 Ωcm, 50 Ωcm, 5 Ωcm, 0.5 Ωcm, 0.09 Ωcm, and 0.03 Ωcm. Note that the n-type impurity concentration of the SiC substrate 10 is 8E18 cm$^{-3}$, and the average resistivity of the n-type impurity concentration is 0.015 Ωcm.

The vertical axis indicates the ratio of the hole density in the active-termination boundary region to the hole density in the center portion of the active region 14. The hole density here refers to the hole density at a portion extending 2 μm from the outermost surface of the SiC substrate 10 toward the buffer layer 12 side. The horizontal axis indicates the distance from the boundary A, with the origin being the boundary A between the active region 14 and the termination region 15, and the positive direction being the chip outer circumferential direction (rightward direction in FIG. 2). For example, a value of −50 μm on the horizontal axis corresponds to a position that is 50 μm or more toward the active region 14 side from the boundary A between the active region 14 and the termination region 15.

FIG. 10 illustrates that, when the n-type impurity concentration in the high resistance region 11 becomes low, that is, when the resistivity of the high resistance region 11 becomes high, the concentration of the hole density, that is, the concentration of the hole current, occurring at the boundary A between the active region 14 and the termination region 15, is alleviated. In particular, it illustrates that when the n-type impurity concentration of the high resistance region 11 is 1E17 cm$^{-3}$ or less, that is, the average resistivity of the high resistance region 11 is 0.09 Ωcm or more, the hole density in the active-termination boundary region is substantially the same as or smaller than the hole density of the active region 14. Note that, within the range of n-type impurity concentrations in the high resistance region 11 from 1E13 cm$^{-3}$ to 1E16 cm$^{-3}$, the tendency of the hole density at the active-termination boundary region remains substantially the same, and in FIG. 10, these lines overlap.

Figure 11:
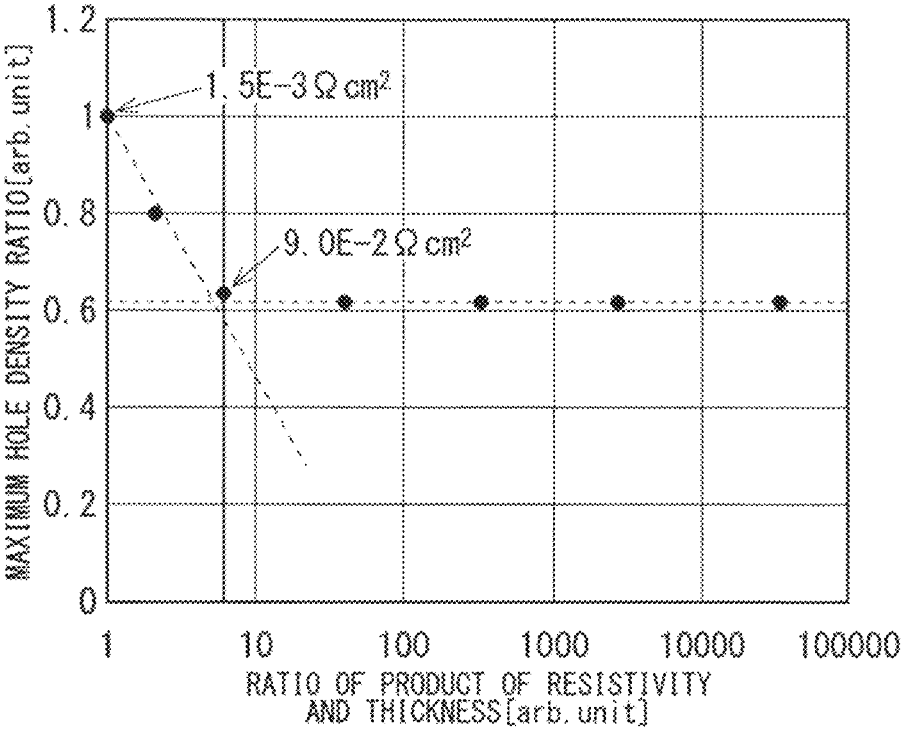
FIG. 11 A graph illustrating simulation results of the silicon carbide semiconductor device according to the Embodiment 1.

FIG. 11 is a simulation result graph of the maximum hole density ratio in which the maximum hole density of the impurity concentration of such as the high resistance region 11 in FIG. 10 is normalized by the reference hole density. A typical SiC substrate with an impurity concentration of 8E18 cm$^{-3}$ was used as a reference. The vertical axis indicates the maximum hole density ratio. The horizontal axis indicates the ratio of the product (Ωcm$^2$) of the resistivity (Ωm) determined from the impurity concentration of the high resistance region 11 and the like in FIG. 10 and the thickness (cm), normalized by the reference product. In other words, the value falling in I on the horizontal axis means that the above-mentioned product of the high resistance region 11, and the like, is the same as the above-mentioned product of a regular SiC substrate. Note that the thickness of the high resistance region 11 and the like is 10 μm as in the simulation of FIG. 10.

FIG. 11 illustrates that the maximum hole density ratio becomes constant when the impurity concentration in the high resistance region 11 is 1E17 cm$^{-3}$ or less, that is, the above product is 9E-562 cm$^2$ (=0.09 Ωcm×1 μm) or more. Specifically, it illustrates, when the above-mentioned product of the high resistance region 11 becomes 6 times or more than the above-mentioned product of the remaining region other than the high resistance region 11 of the SiC substrate, the maximum hole density ratio becomes constant.

From this, it is desirable that the above-mentioned product of the high resistance region 11 with respect to the remaining area of the SiC substrate 10 be six times or more of the above-mentioned product. Since the thickness direction of the high resistance region 11 coincides with the direction in which the current flows; therefore, the high resistance region 11 can be regarded as a series resistance with respect to the hole current. In the above calculation, although the thickness of the high resistance region 11 was set to 10 μm, the thickness of the high resistance region 11 is not limited to 10 μm, and the thickness thereof may be such that the above product of the high resistance region 11 is six times or more greater than the above product of the remaining region of the SIC substrate. Also, the resistivity of the high resistance region 11 in the thickness direction may not be constant.

Figure 12:
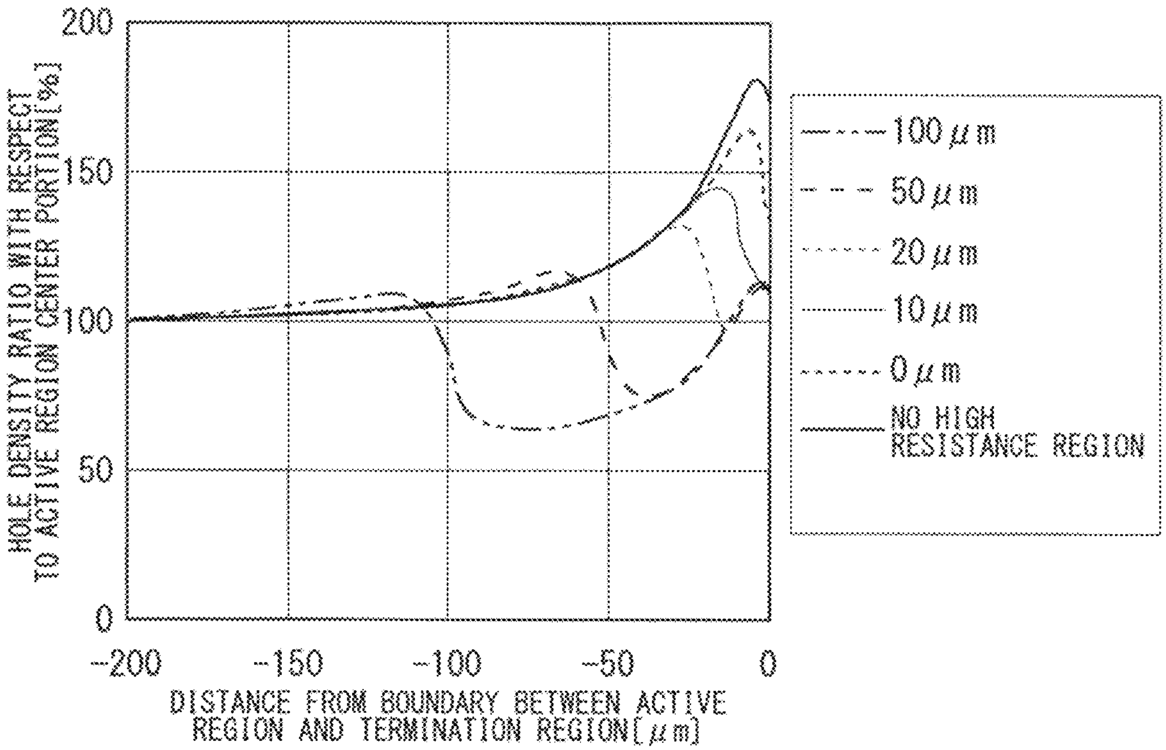
FIG. 12 A graph illustrating simulation results of the silicon carbide semiconductor device according to the Embodiment 1.

FIG. 12 is a simulation result graph illustrating the relationship between the length in the extending direction of the portion of the high resistance region 11 extending from the boundary A between the active region 14 and the termination region 15 toward the active region 14 and the maximum hole density ratio. 100 μm, 50 μm, 20 μm, and 10 μm illustrated in FIG. 12 mean the lengths along the extending direction of the portion of the high resistance region 11 that extends from the boundary A between the active region 14 and the termination region 15 toward the active region 14 side are 100 μm, 50 μm, 20 μm, or 10 μm. In this simulation, the applied current is 1000A/cm$^2$. The impurity concentration of the high resistance region 11 is 1E17 cm$^{-3}$, and the thickness of the high resistance region 11 is 10 μm. The vertical axis and horizontal axis of FIG. 12 are similar to those of the vertical axis and horizontal axis of FIG. 10, and the hole density refers to the hole density at a portion extending 2 μm from the uppermost surface of the SiC substrate 10 toward the buffer layer 12 side.

From FIG. 12, it can be seen that the longer the length in the extending direction of the portion of the high resistance region 11 extending from the boundary A between the active region 14 and the termination region IS toward the active region 14, the lower the hole density ratio with respect to the center portion of the active region 14. In particular, it can be seen that by setting the above length to 50 μm or more, the hole density near the boundary A between the active region 14 and the termination region 15 becomes substantially the same as the hole density at the center portion of the active region 14. Therefore, the length along the extending direction of the portion of the high resistance region 11 extending from the boundary A between the active region 14 and the termination region 15 toward the active region 14 is preferably 50 μm or more.

Summary of Embodiment

By providing a high resistance region 11 in the region where current concentration occurs, the hole current injected from the first well regions 31 and the second well region 32 selectively flows along the extending direction of the buffer layer 12, which is a region of low resistance. Accordingly, compared to the conventional structure, the length through which holes pass through the buffer layer 12 that promotes hole recombination can be increased; therefore, the density of holes reaching the SiC substrate 10 can be reduced.

Consequently, the concentration of hole current occurred in the active-termination boundary region is alleviated, suppressing stacking faults generated from the SiC substrate 10 in the active-termination boundary, thereby enhancing the reliability of the silicon carbide semiconductor device 100. Further, the buffer layer 12 that suppresses the occurrence of stacking faults can be made thinner, this allows to maintain productivity of the silicon carbide semiconductor device 100.

Note that if the entire region of the SiC substrate 10 is made to have high resistance, the element resistances of the body diode and the MOSFET would increase significantly. Whereas, in Embodiment 1, the high resistance region 11 is provided in a portion of the SiC substrate 10; therefore, an increase in element resistance can be suppressed and the characteristics of the body diode can be maintained.

Embodiment 2

<Configuration>

In Embodiment 1, ions, which are p-type impurities, were implanted into a portion of the SiC substrate 10 to form the high resistance region 11 in the n-type SiC substrate 10. With this, electrons, which are n-type carriers, and holes, which are p-type carriers, cancel each other out, lowering the effective carrier concentration, realizing high resistance of a portion of the SiC substrate 10. Nevertheless, the increase in resistance of a portion of the SiC substrate 10 is not limited thereto, and this can also be achieved by implanting ions that form a deep level in the bandgap of SiC. By implanting vanadium ions as such ions into a portion of the SiC substrate 10, the effective increase in resistance of the portion of the SiC substrate 10 is enabled.

<Method of Manufacturing>

Next, a method of manufacturing the silicon carbide semiconductor device 200 according to Embodiment 2 will be described. First, as in Embodiment 1, as illustrated in FIG. 3, a low-resistance n-type SiC substrate 10 with a (0001) plane orientation having a 4H polytype and the upper surface, being the main surface, having an off-angle is prepared. Then, as illustrated in FIG. 4, an implantation mask 81 is formed on the front surface of the SiC substrate 10 using a metal mask, an oxide film mask, a resist mask, or the like. Then, as illustrated in FIG. 5, ions are implanted into a temporary region 11*a* of the SiC substrate 10 without implanting the ions into any region other than the temporary region 11*a*, the temporary region 11*a* being to become the high resistance region 11 of the SIC substrate 10. The implanted ions are ions such as vanadium ions that form a deep level in the bandgap of SiC. The impurity concentration of ion implantation is, for example, $1\times10^{17}$ cm$^{-3}$ or more and $2\times10^{19}$ cm$^{-3}$ or less. The energy for ion implantation is, for example, 10 keV or more and 10 MeV or less. Thereafter, the same processes after FIG. 6 as those described in Embodiment 1 are performed to form the high resistance region 11 and the like.

Summary of Embodiment 2

The silicon carbide semiconductor device 100 according to Embodiment 2 has the above configuration, so that, similar to Embodiment 1, the reliability of the silicon carbide semiconductor device 100 can be enhanced, and the productivity of the silicon carbide semiconductor device 100 and the characteristics of the body diode can be maintained. Further, according to Embodiment 2, it becomes unnecessary to control the ion implantation with high precision to address the variation in impurity concentration of the SiC substrate 10, thereby facilitating the manufacturing processes.

Modification

Each Embodiment may be combined as appropriate. For example, the high resistance region 11 may be formed by simultaneously implanting p-type impurities and ions that form a deep level. Alternatively, a portion of the high resistance region 11 may be formed by implanting ions, which are p-type impurities, and the remaining portion of the high resistance region 11 may be formed by implanting ions that form a deep level.

Further, although in the above description, the silicon carbide semiconductor device according to each Embodiment is a MOSFET, it is not limited thereto, and is, for example, an Insulated Gate Bipolar Transistor (IGBT) or a Reverse Conducting IGBT (RC-IGBT), or the like.

It should be noted that Embodiments and Modifications can be arbitrarily combined and can be appropriately modified or omitted.

The forgoing description is in all aspects illustrative and not restrictive. It is therefore understood that numerous undescribed Modifications can be devised.

EXPLANATION OF REFERENCE SIGNS

1 SiC epitaxial substrate, 3 source pad, 10 SiC substrate, 11 high resistance region, 11*a* temporary region, 12 buffer layer, 13 drift layer, 14 active region, 15 termination region, 21 source region, 31 first well region, 32 second well region, 35 JTE region, 41 gate insulating film, 42 gate electrode, 100 silicon carbide semiconductor device, A boundary,

The invention claimed is:

1. A silicon carbide semiconductor device comprising:

a semiconductor structure including a silicon carbide substrate of a first conductivity type, a buffer layer of the first conductivity type provided on the silicon carbide substrate, and a drift layer of the first conductivity type provided on the buffer layer;

a source pad;

a gate insulating film; and a gate electrode, wherein in the semiconductor structure, an active region and a termination region connected to the active region along the outer periphery of the active region are defined, the active region of the semiconductor structure includes a source region of the first conductivity type selectively provided in an upper portion of the drift layer and electrically connected to the source pad, and a first well region of a second conductivity type that isolates the source region from the drift layer and is insulated from the gate electrode by the gate insulating film, the termination region of the semiconductor structure includes a second well region of the second conductivity type provided in the upper portion of the drift layer, and a JTE region of the second conductivity type provided outside of the second well region, the silicon carbide substrate includes a high resistance region provided in the termination region, or provided in the termination region and a portion of the active region that is in contact with the termination region, and in contact with the buffer layer, and resistance of the high resistance region is higher than resistance of a remaining region of the silicon carbide substrate other than the high resistance region.

2. The silicon carbide semiconductor device according to claim 1, wherein a product of an average resistivity of the high resistance region and a thickness of the high resistance region is six times or more a product of an average resistivity of the remaining region and a thickness of the remaining region.

3. The silicon carbide semiconductor device according to claim 1, wherein a product of the average resistivity of the high resistance region and the thickness of the high resistance region is 9E-5Ωcm$^2$ or more.

4. The silicon carbide semiconductor device according to claim 1, wherein a length along an extending direction of a portion of the high resistance region that extends from the boundary between the active region and the termination region toward the active region side is 50 μm or more.

5. The silicon carbide semiconductor device according to claim 1, wherein an impurity concentration of the first conductivity type of the buffer layer is $1\times10^{18}$ cm$^{-3}$ or more and $1\times10^{19}$ cm$^{-3}$ or less.

6. The silicon carbide semiconductor device according to claim 1, wherein an impurity concentration of the first conductivity type of the drift layer is $5\times10^{16}$ cm$^{-3}$ or less.

7. A method of manufacturing the silicon carbide semiconductor device according to claim 1, comprising:

implanting ions into a temporary region of the silicon carbide substrate without implanting the ions into a region other than the temporary region, the temporary region being to become the high resistance region of the silicon carbide substrate;

forming the buffer layer and the drift layer on the silicon carbide substrate into which the ions have been implanted by epitaxial growth; and forming the source region and the first well region included in a field effect transistor in a region of the drift layer that is to become the active region.

8. The method of manufacturing the silicon carbide semiconductor device according to claim 7, wherein the ions are impurities of the second conductivity type.

9. The method of manufacturing the silicon carbide semiconductor device according to claim 7, wherein the ions are vanadium ions.

* * * * *